United States Patent

Hoshino et al.

[11] Patent Number: 6,107,879
[45] Date of Patent: Aug. 22, 2000

[54] AUTOMATIC DYNAMIC RANGE CONTROL CIRCUIT

[75] Inventors: Toshio Hoshino; Kazuhiro Daikoku; Kenji Yamada, all of Tokyo; Tomokazu Takasaki, Kanagawa, all of Japan

[73] Assignees: Nippon Telegraph & Telephone Corp.; NTT Electronics Corp.; Asahi Kasei Microsystems Co., Ltd., all of Tokyo, Japan

[21] Appl. No.: 09/318,765

[22] Filed: May 26, 1999

Related U.S. Application Data

[63] Continuation of application No. PCT/JP97/04457, Dec. 5, 1997.

[30] Foreign Application Priority Data

Dec. 6, 1996 [JP] Japan ..................................... 8-325787

[51] Int. Cl.⁷ ....................................................... H01P 7/08
[52] U.S. Cl. ..................... 330/129; 330/124 R; 330/280; 381/106; 333/14
[58] Field of Search ............................. 333/14; 381/106; 330/124 R, 129, 280

[56] References Cited

FOREIGN PATENT DOCUMENTS

| | | |
|---|---|---|
| 54-137946 | 10/1979 | Japan . |
| 59-148417 | 8/1984 | Japan . |
| 8-51331 | 2/1995 | Japan . |

OTHER PUBLICATIONS

Jack Smith, "Modern Communication Circuits," McGraw–Hill Book Company, 1986, pp. 188–198.

*Primary Examiner*—Michael B Shingleton
*Attorney, Agent, or Firm*—Pillsbury Madison & Sutro LLP

[57] ABSTRACT

An automatic dynamic range control circuit is provided with a fixed-gain first circuit means and a variable-gain second circuit means having substantially the same propagation delay as the first circuit means. The automatic dynamic range control circuit holds the peak value of an input signal, selects the first circuit means when this peak value is smaller than a reference signal level, and selects the second circuit means when the peak value exceeds this reference signal level. When the held peak value is smaller than the reference signal level, the second circuit means is operated at the same gain relative to an input signal as the first circuit means by having its gain set by the reference signal. When the held peak value exceeds the reference signal, the gain of the second circuit means is limited by this held peak value and its output level is kept at or below a prescribed level. As a result, when an excessively high input signal level is fed, the first circuit means can be switched to the second circuit means without giving rise to discontinuity in the waveform of the output signal on either the time axis or the amplitude axis.

8 Claims, 9 Drawing Sheets

AUTOMATIC DYNAMIC RANGE CONTROL CIRCUIT

This is a Continuation of International Appln. No. PCT/JP97/04457 filed Dec. 5, 1997.

TECHNICAL FIELD

The present invention relates to techniques for keeping a level of audio signals with a wide dynamic range such as the human voice, music, and so on at or below a prescribed level. It relates in particular to an automatic dynamic range control circuit employing a feedforward configuration to automatically control a circuit gain.

BACKGROUND TECHNOLOGY

When an audio amplifier amplifies an electrical signal that the human voice is converted into using a microphone, the output of the amplifier may saturate and distort if a speaker speaks too loudly due to lack of experience of using the microphone. Even though the speaker speaks at a suitable level, the same phenomena may happen due to the wide dynamic range of the human voice. On the other hand, the dynamic range of an audio signal such as music is sometimes narrowed by amplification. An automatic dynamic range control circuit has hitherto been used to prevent such distortions, and an automatic gain control (AGC) circuit is a well-known type of automatic dynamic range control circuit.

By automatically controlling the amplification factor of an amplifier, an automatic gain control circuit keeps the amplifier output level at or below a prescribed level. The automatic gain control circuits, for example, are introduced into acoustic electronic equipment for processing audio signals, of which dynamic range is inherently restricted.

Automatic gain control circuits are also utilized in RF (radio frequency) and/or IF (intermediate frequency) circuits of radio equipment. When a transceiver receives too strong a signal, the gain of the receiver circuit is automatically adjusted so that no intermodulation distortion caused by the amplifier is generated, thereby this makes it possible to increase the dynamic range of the receiver circuit.

Automatic gain control circuits are constructed with either feedback or feedforward circuit configurations. The following reference relates to automatic gain control circuits that employ a feedback loop circuit:
(1) Jack Smith, *"Modern communication circuits"*, McGraw-Hill, Chapter 5.4, pp.188–198 (New York, 1986)
and the following references relate to automatic gain control circuits which employ a feedforward loop circuit:
(2) Japanese Patent Application Laid-open No. 54-137946
(3) Netherlands Patent Application No. 8300468
(4) Japanese Patent Application Laid-open No. 8-51331.

Reference (1) describes typical examples of an automatic gain control circuit employing a feedback loop configuration. In principle, however, if the input signal level abruptly changes, an AGC circuit based on a feedback loop concept will exhibit a transient response characterized by both an attack and decay time. This transient response is strongly dependent on circuit parameters such as a circuit configuration and cut-off frequency of the low-pass (loop) filter inserted in order to stabilize the operation of the feedback loop circuit. An automatic gain control circuit associated with this sort of overshoot characteristic is not applicable to a level control circuit where a certain level must absolutely never be exceeded however large an input signal becomes.

As far as it goes, a feedforward loop configuration provides a solution to this sort of overshoot problem. For example, the circuit configuration disclosed in Reference (2) sets the gain of the automatic gain control circuit in accordance with the peak level of the input signal so that the output can be kept at or below a prescribed value however large the input signal is.

However, the circuit configuration disclosed in Reference (2) results in the automatic gain control operating even when the input signal level is low, in which case due to the effects of the thermal noise inherently generated by amplifiers, the signal-to-noise ratio will naturally be lower. If an automatic gain control circuit operates in response to this sort of signal, the noise components predominate in the output signal (which has been held to a prescribed level) so that changes in the input signal level result in very poor sound quality with varying noise levels.

As opposed to this, in the circuit configuration disclosed in Reference (3) the gain is fixed for low level input signals, but is controlled in a nonlinear manner when the input signal level is high. However, because the dynamic range control is nonlinearly operated in response to an input signal, a problem encountered with this control method is that distortion is produced in the output signal.

With the circuit configuration disclosed in Reference (4), when the input signal level is less than a reference signal level the gain is fixed, thereby suppressing any rise in output noise level, and when the input signal level exceeds the reference signal level, the gain is controlled, thereby keeping the output level at or below a prescribed level.

In order to switch between a fixed-gain state and a state in which gain is variably controlled in accordance with the input signal level, the circuit configuration of Reference (4) is used for controlling the gain of a voltage-controlled amplifier circuit. The transition from the fixed-gain state to output level restriction is therefore performed over a certain range of input signal levels. Another circuit configuration that has been considered is to arrange a fixed-gain amplifier and a voltage-controlled amplifier circuit in parallel, with the fixed-gain amplifier being selected when the input signal level is smaller than a reference signal level, and being switched to the voltage-controlled amplifier circuit when the input signal level exceeds the reference signal level. In this case the propagation delays of the fixed-gain amplifier and the voltage-controlled amplifier circuit would be made equal in advance so that the waveform exhibits no distortion on the time axis when the changeover is made from the fixed-gain amplifier to the voltage-controlled amplifier circuit.

However, any difference in the gain of the fixed-gain amplifier and the voltage-controlled amplifier circuit will result in discontinuity on the amplitude axis and in resulting waveform distortion.

It is an object of the present invention to overcome these problems and to provide an automatic dynamic range control circuit such that no discontinuity occurs in the output signal waveform when a fixed-gain amplifier is switched over to a voltage-controlled amplifier circuit, and vice versa, in accordance with the input signal level.

DISCLOSURE OF THE INVENTION

An automatic dynamic range control circuit according to the present invention comprises: fixed-gain first circuit means; variable-gain second circuit means with a propagation delay substantially equal to that of the first circuit means; peak value hold means for holding the peak value of the input signal; comparison means for comparing the value held by this peak value hold means with a preset reference signal level; and first selection means which, on the basis of the result of the comparison by this comparison means, selects the first circuit means when the value held by the peak value hold means is smaller than the reference signal level, and selects the second circuit means when the value held by the peak value hold means exceeds the reference signal level. It is a distinguishing feature of this automatic dynamic range control circuit that it also comprises second selection means which, on the basis of the result of the comparison by the comparison means, selects the reference signal when the value held by the peak value hold means is smaller than the reference signal level, and selects the value held by the peak value hold means when this value exceeds the reference signal level, and outputs whichever value has been selected as a control signal for setting the gain of the second circuit means. It is a further distinguishing feature of this automatic dynamic range control circuit that the maximum output level of the second circuit means is limited by the control signal. Namely, the second circuit means keeps its output level substantially constant when the value held by the peak value hold means has been input as the control signal, and operates with a fixed gain substantially equal to that of the first circuit means when the reference signal has been input as the control signal.

A delay means is preferably provided at the input of the first and second circuit means, this delay means serving to delay the signal input to the first and second circuit means until the gain of the second circuit means has been set in response to the input signal.

Means which outputs an alarm signal when the peak value of the input signal exceeds a predetermined level can also be provided. When dealing for example with human voice signals, if the input signal level shows signs of exceeding the control range of the automatic dynamic range control circuit, provision of such an alarm signal output means can draw attention to this fact by causing a warning light to flash, with the aim of getting the speaker to speak more quietly.

The reference signal level and the corresponding maximum output level of the second circuit means are preferably variable. The following arrangement is therefore desirable. Namely, reference voltages generating means for generating reference voltages (qE and rE) which are in a fixed mutual ratio is provided, one of these reference voltages (qE) is used as a reference signal, and the gain of the second circuit means is determined by the ratio of the reference signal and one of the reference voltages (which can be the same voltage as that of the reference signal). The effect of this arrangement is that the maximum output level of the second circuit means can be variably set by changing the reference voltage (i.e., by changing the value of E), without any change of circuit constants and without affecting the gain when the circuit operates at a fixed gain.

A second circuit means of this sort can comprise a division circuit which divides the input signal by the output of the second selection means, and a multiplication circuit which multiplies the output of this division circuit by one of the reference voltages. Alternatively, it can comprise multiplication means which multiplies the input signal by one of the reference voltages, and division means which divides the output of this multiplication means by the output of the second selection means. Alternatively, it can comprise first division means which divides the output of the second selection means by one of the reference voltages, and second division means which divides the input signal by the output of this first division means. Alternatively, it can comprise division means which divides one of the reference voltages by the output of the second selection means, and multiplication means which multiplies the input signal by the output of this division means.

Embodiments of this invention will now be described with reference to the accompanying drawings.

PREFERRED EMBODIMENTS OF THE INVENTION

Figure 1:
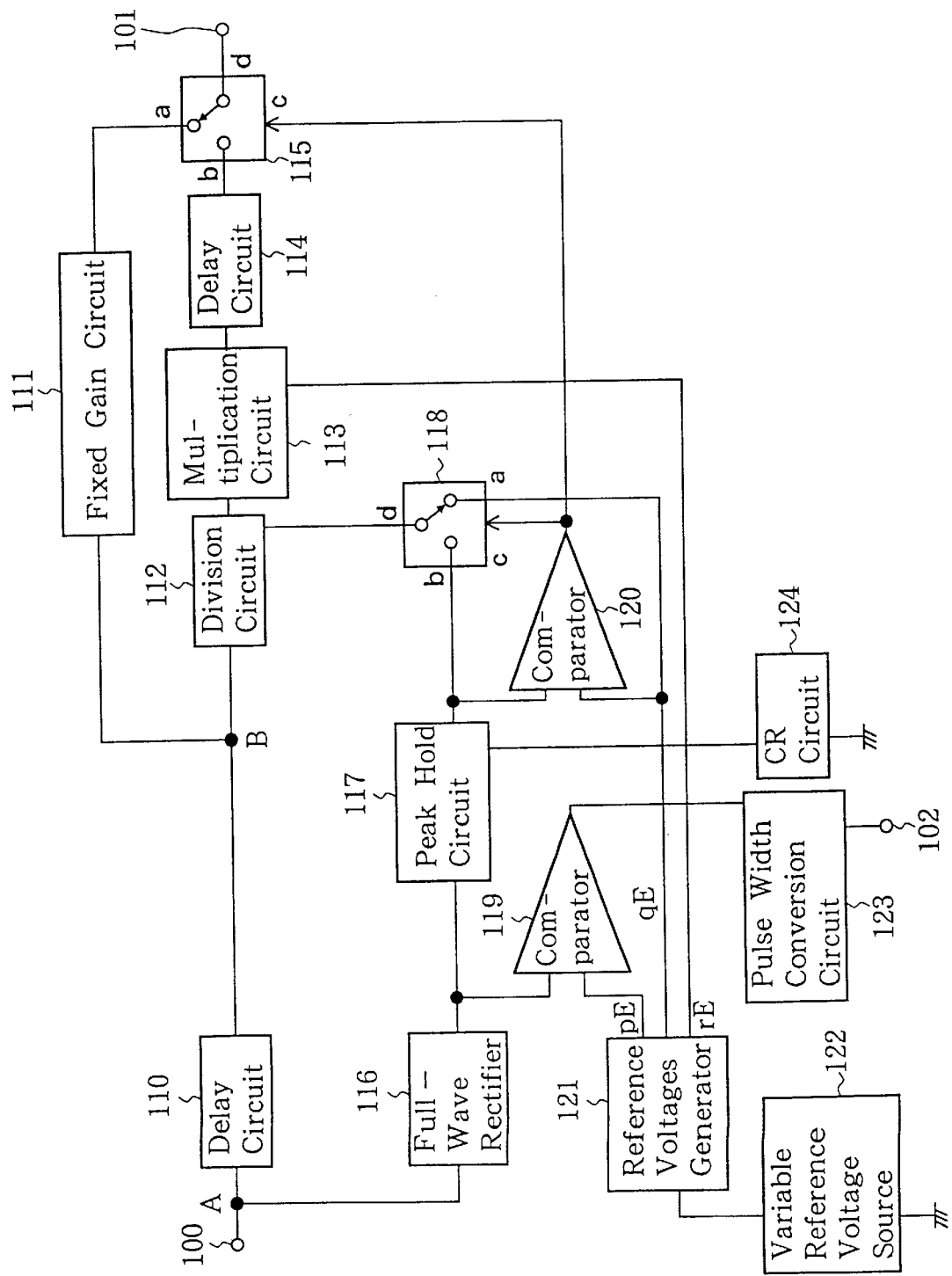
FIG. 1 is a block diagram of a first embodiment of the invention.

FIG. 1 is a block diagram of an automatic dynamic range control circuit according to a first embodiment of this invention. This circuit comprises input terminal 100, output terminal 101, output terminal 102 for a signal causing a warning lamp to flash, delay circuits 110 and 114, fixed gain circuit 111, division circuit 112, multiplication circuit 113, switching circuit 115, full-wave rectifying circuit 116, peak hold circuit 117, switching circuit 118, comparators 119 and 120, reference voltages generator 121, variable reference voltage source 122, pulse width conversion circuit 123, and CR circuit 124 for controlling the decay time of peak hold circuit 117.

A description will now be given of the signal flow in this first embodiment and of the functions of its various circuits.

A signal f(t) input from input terminal 100 is first of all split into two branches at point A, with one branch being delayed by delay circuit 110 having a delay of $\gamma$, giving a signal $K1 f(t-\gamma)$, where K1 is the amplification factor (or attenuation) of delay circuit 110. The output of delay circuit 110 is split into two branches at point B, with one branch being delayed by fixed gain circuit 111 having a delay of $v$, giving a signal $K1 K2 f(t-\gamma-v)$ which is fed to input terminal a of switching circuit 115. K2 is the amplification factor (or attenuation) of fixed gain circuit 111.

The other branch of the signal, which was input from input terminal 100 and branched at point A, is full-wave rectified by full-wave rectifying circuit 116, giving signal $Rc(t-\sigma)$, where $\sigma$ is the delay in full-wave rectifying circuit 116. Peak hold circuit 117 is then used to obtain the peak value $Pd(t-\sigma-\tau)$ of the output signal from full-wave rectifying circuit 116, where $\tau$ is the delay of the peak hold circuit. The decay time of peak hold circuit 117 is adjusted by CR circuit 124 comprising a parallel array of capacitors (C) and resistors (R). The decay time should be as long as possible in order to avoid distortion in the output signal, but too long a decay time will result in unnatural sounding output in the case of the human voice signal, and therefore the optimum value should be obtained experimentally. The output signal from peak hold circuit 117 is fed to input terminal b of switching circuit 118.

Variable reference voltage E is generated by variable reference voltage source 122 and supplied to reference voltages generator 121, which generates voltages pE, qE and rE.

Voltage pE is supplied to comparator 119 where it is compared with the output signal Rc(t−σ) of full-wave rectifying circuit 116. Comparator 119 outputs a high level signal if the output of full-wave rectifying circuit 116 is larger than voltage pE, and a low level signal if the output is smaller. After the time width of this output signal has been converted by pulse width conversion circuit 123, comprising a monostable multivibrator or the like, the resulting signal is output to terminal 102 as a signal which causes an alarm lamp to flash. In the configuration described above, the signal which causes an alarm lamp to flash is obtained by means of separately provided comparator 119, but it is also feasible to use, for this purpose, the output (control) signal of comparator 120.

Voltage qE generated by reference voltages generator 121 is fed to input terminal a of switching circuit 118, which is set up so that terminal a to terminal d is conductive when the control signal is at a low level, and terminal b to terminal d is conductive when the control signal is at a high level. The output signal from peak hold circuit 117 is compared with voltage qE by comparator 120, which outputs a low level signal if the output of peak hold circuit 117 is smaller than voltage qE, and a high level signal if it is larger. The signal output from comparator 120 is supplied to control terminal c of switching circuit 118.

The other branch of the signal branched at point B is divided in division circuit 112 by the output signal of switching circuit 118 and then multiplied in multiplication circuit 113 by voltage rE output from reference voltages generator 121. The output signal from multiplication circuit 113 then passes through delay circuit 114 with delay $\xi$ and amplification factor (or attenuation) K3, and is fed to input terminal b of switching circuit 115.

Switching circuit 115 is set up so that a to d is conductive when the control signal obtained from the output of comparator 120 is low, and b to d is conductive when the control signal is high. The signal, which appears at output terminal d of switching circuit 115, is fed to output terminal 101.

This operation of the automatic dynamic range control circuit of FIG. 1 can be divided into the following two cases, according to the level of the control signal obtained from the output of comparator 120, which in turn depends on reference voltage qE. The respective states involved in these two cases will now be described in greater detail using mathematical expressions.

Firstly, when the output (control) signal of comparator 120 is low, i.e., when $$Pd(t-\sigma-\tau) < qE$$

path a–d through switching circuit 115 is conductive, and hence given a signal f(t) input from input terminal 100 and passing through delay circuit 110 and fixed gain circuit 111, the signal obtained at output terminal 101 will be:

$$K1 \cdot K2 \cdot f(t-\gamma-\nu) \quad (1)$$

Meanwhile, division circuit 112 divides the signal branched at point B by the signal that has passed through path a–d of switching circuit 118. Multiplication circuit 113 then multiplies the output of division circuit 112 by voltage rE generated by reference voltages generator 121, and the result of this multiplication appears at terminal b of switching circuit 115 as the following signal:

$$(K1 \cdot K3 \cdot f(t-\gamma-\zeta-\eta-\xi) \div qE) \cdot rE = K1 \cdot K3 \cdot (r/q) \cdot f(t-\gamma-\zeta-\eta-\xi) \quad (2)$$

where $\zeta$ is the delay of division circuit 112 and $\eta$ is the delay of multiplication circuit 113.

Next, if the output of comparator 120 goes high, i.e., if $$Pd(t-\sigma-\tau) \geq qE$$

path b–d through switching circuit 118 becomes conductive, and hence the signal obtained at terminal b of switching circuit 115 will be:

$$K1 \cdot K3 \cdot (rE \div Pd(t-\sigma-\tau)) \cdot f(t-\gamma-\zeta-\eta-\xi) \quad (3)$$

This signal will pass through switching circuit 115 and be output at output terminal 101.

In this embodiment, the state of terminal a immediately before switching circuit 115 switches can be described by Equation (1) above, and likewise the state of terminal b immediately before switching circuit 115 switches can be described by Equation (2). It follows that the value of Equation (1) and the value of Equation (2) must be equal in order for the waveform present at output terminal 101 to be smooth and continuous immediately after the circuit has switched. Also, the delay $\gamma$ of delay circuit 110 and the total delay $\sigma+\tau$ of full-wave rectifying circuit 116 and peak hold circuit 117 must be equal in order for the gain of the input signal to be controlled in accordance with its signal level. Setting these conditions, we get:

$$K2 = K3(r/q)$$

$$\nu = \zeta + \eta + \xi$$

$$\gamma = \sigma + \tau \quad (4)$$

It may be noted that this consideration of the operation of the first embodiment has assumed that the delays of switching circuits 115 and 118, and of comparators 119 and 120, are negligible in comparison with the delays of the other circuits.

In the configuration described above, the delay circuits are not restricted to circuits the sole purpose of which is to produce a delay. For example, if human voice signals are to be dealt with, low-pass filters can be used as delay circuits 110 and 114. Moreover, the relation between the delay of delay circuit 110 and the delays of full-wave rectifying circuit 116 and peak hold circuit 117 does not have to be exactly $\gamma = \sigma + \tau$, and can also be:

$$\gamma \geq \sigma + \tau.$$

The operation and effects of the first embodiment of this invention, described above, can now be summarized as follows:

(1) If the conditions expressed by Equation (4) are satisfied, the waveform present at output terminal 101 will be smooth and continuous on both the amplitude and time axes immediately before and immediately after switching circuits 115 and 118 switch.

(2) The requirement for a waveform with no amplitude discontinuity is satisfied because the amplification factor (or attenuation) is a constant and independent of the voltage E of variable reference voltage source 122.

(3) This means that a fixed amplification factor (or attenuation) region is used when the input signal level is low.

(4) If the output level of peak hold circuit 117 exceeds the switching level, switching circuits 115 and 118 both switch, and an output which does not exceed a prescribed level is obtained at terminal 101. This output can be represented by Equation (3).

(5) The level of this output, which is controlled so as not to exceed a prescribed level, can be changed by changing the voltage E of variable reference voltage source 122.

(6) A waveform with no overshoot can be obtained if a circuit with a very short rise time is used for peak hold circuit 117.

(7) Optimizing the decay time of peak hold circuit 117 enables a waveform with little distortion to be obtained even for a signal which has had its dynamic range controlled.

(8) A signal capable of making an alarm lamp flash can be output.

Figure 2A:
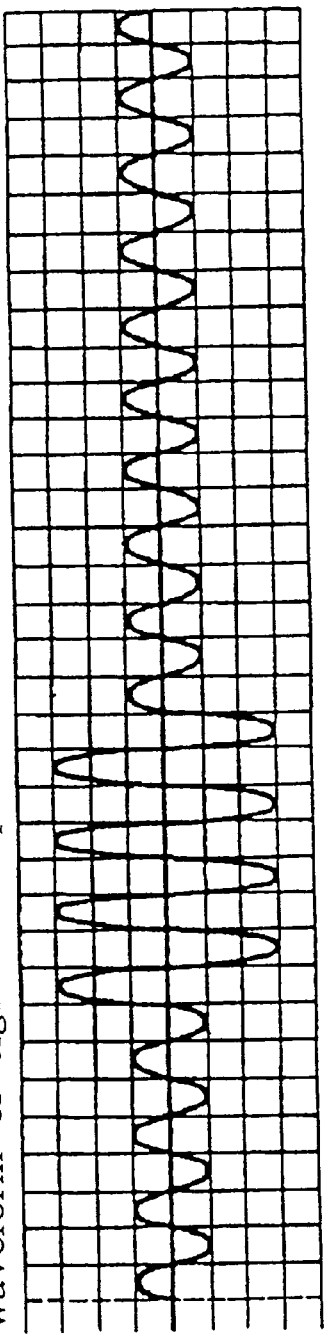
FIG. 2a–FIG. 2e show, in schematic form, the signal waveforms at various parts of the first embodiment.
Figure 2B:
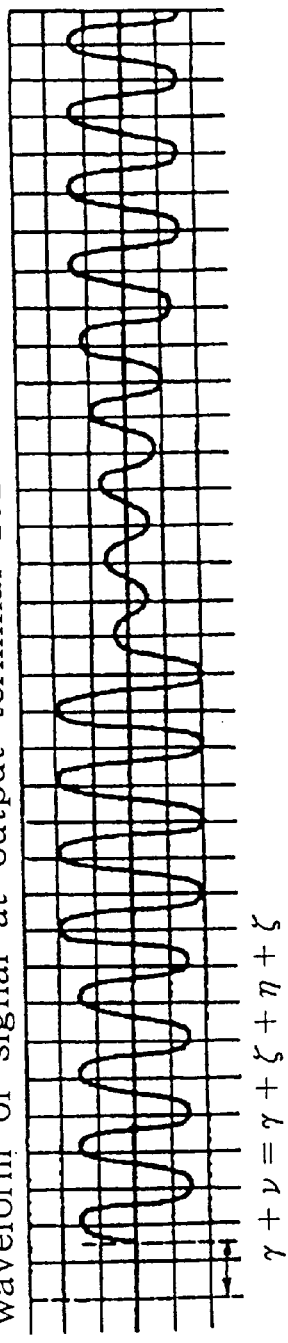
Figure 2C:
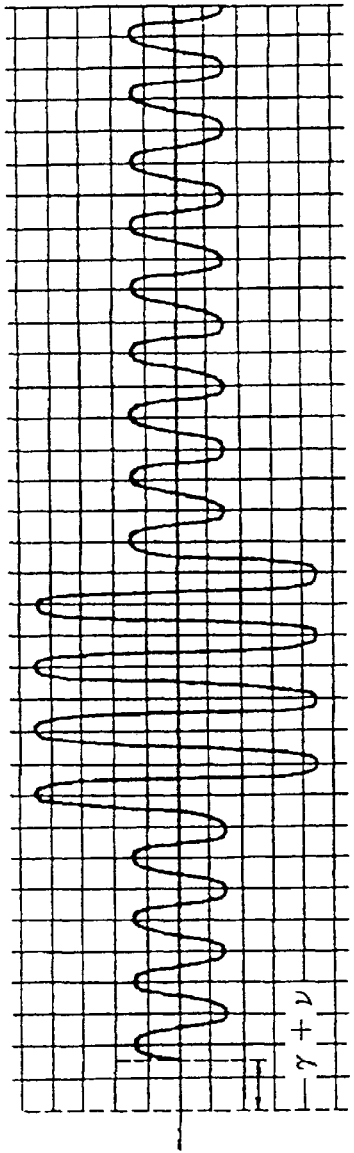
Figure 2D:
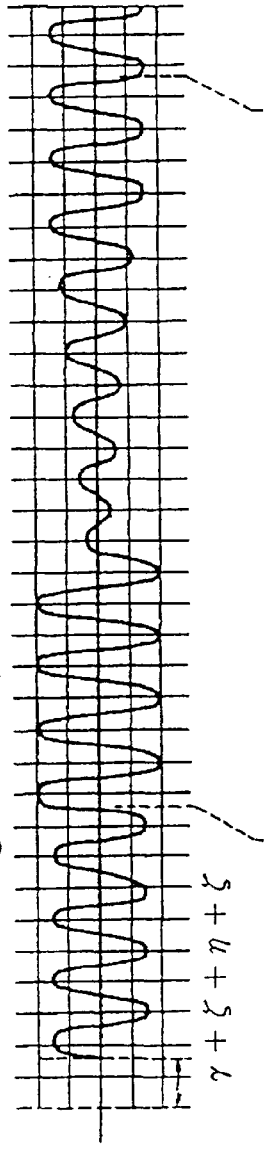
Figure 2E:
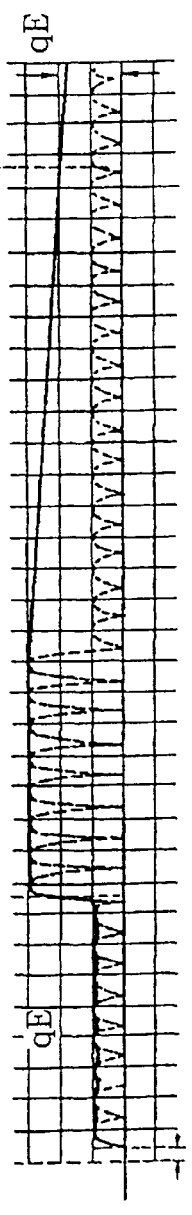
Figure 3:
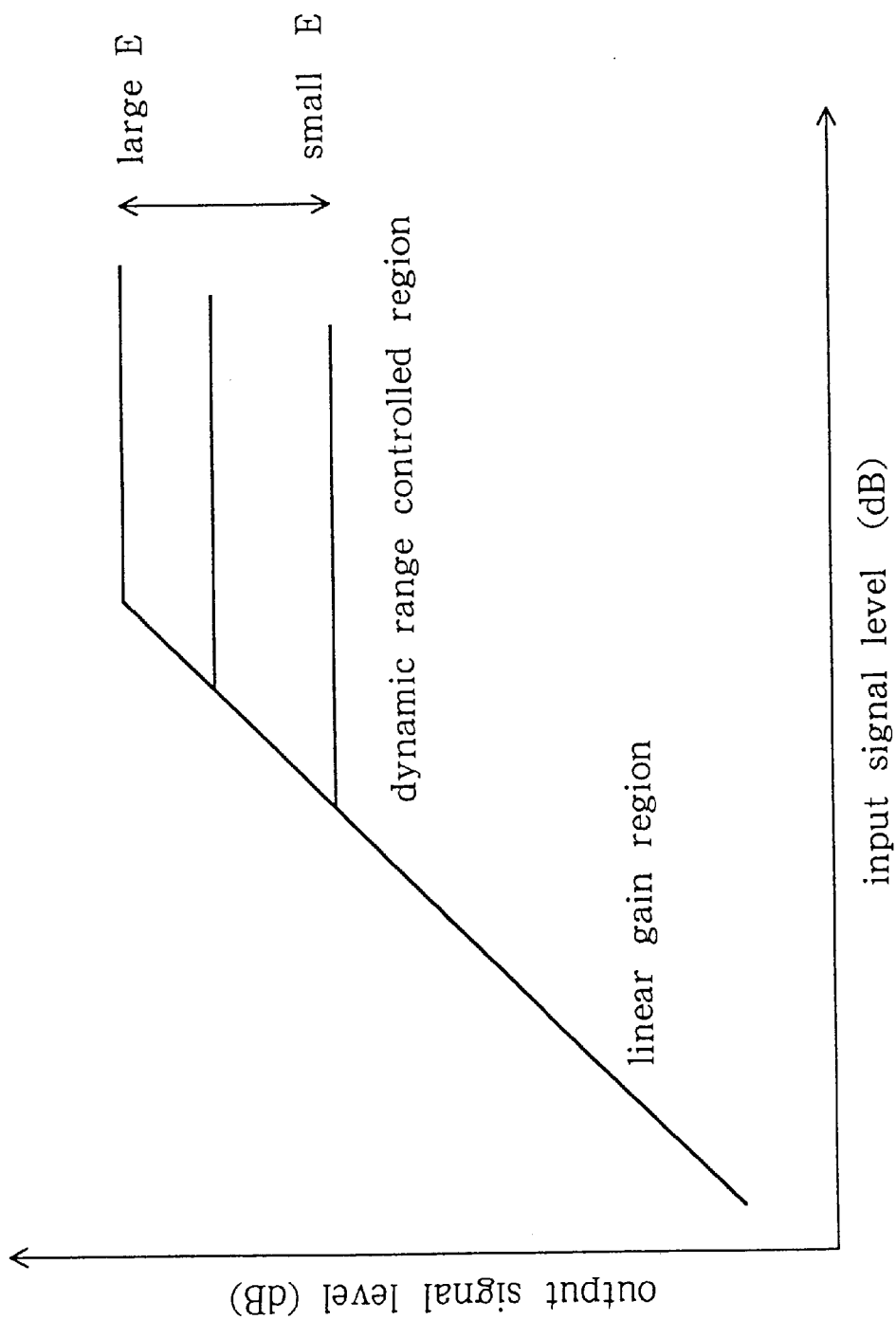
FIG. 3 serves to explain the amplitude restriction characteristics of this invention.

The matters described above will be further explained with reference to FIGS. 2a–2e and FIG. 3. FIGS. 2a–2e respectively show the waveform of the signal: FIG. 2a input to input terminal 100, FIG. 2b output from output terminal 101, FIG. 2c at input terminal a of switching circuit 115, FIG. 2d at input terminal b of switching circuit 115, and FIG. 2e output from peak hold circuit 117. The broken line in FIG. 2e shows the waveform of the signal output from full-wave rectifying circuit 116. FIG. 3 serves to explain the amplitude limitation characteristics of the automatic dynamic range control circuit of the first embodiment.

FIG. 2a shows an example of an input signal waveform having a portion which has increased in amplitude. It will be seen that by controlling the amplitude of this portion using the output signal waveform of the peak hold circuit, illustrated in FIG. 2e, and adjusting the delay, the output signal obtained has a smooth waveform and a narrowed dynamic range, as shown in FIG. 2b.

Referring to FIG. 3, it will be seen that by changing the variable reference voltage E, only the level at which the output signal is held to a prescribed level is changed, with no change being made to the amplification factor (or attenuation) of the linear gain region.

To implement the individual circuits used in the first embodiment, division circuit 112 and multiplication circuit 113 can be constructed by referring to undernoted Reference (5), and full-wave rectifying circuit 116 and peak hold circuit 117 can be constructed by referring to undernoted Reference (6):

(5) U.S. Pat. No. 5,150,324 (Japanese Patent Application Laid-open No. 5-42032)

(6) Roubik Gregorian and Gabor C. Temes, *"Analog MOS integrated circuits for signal processing"*, John Wiley & Sons, Chapter 6, pp.411–529 (New York, 1986).

Figure 4:
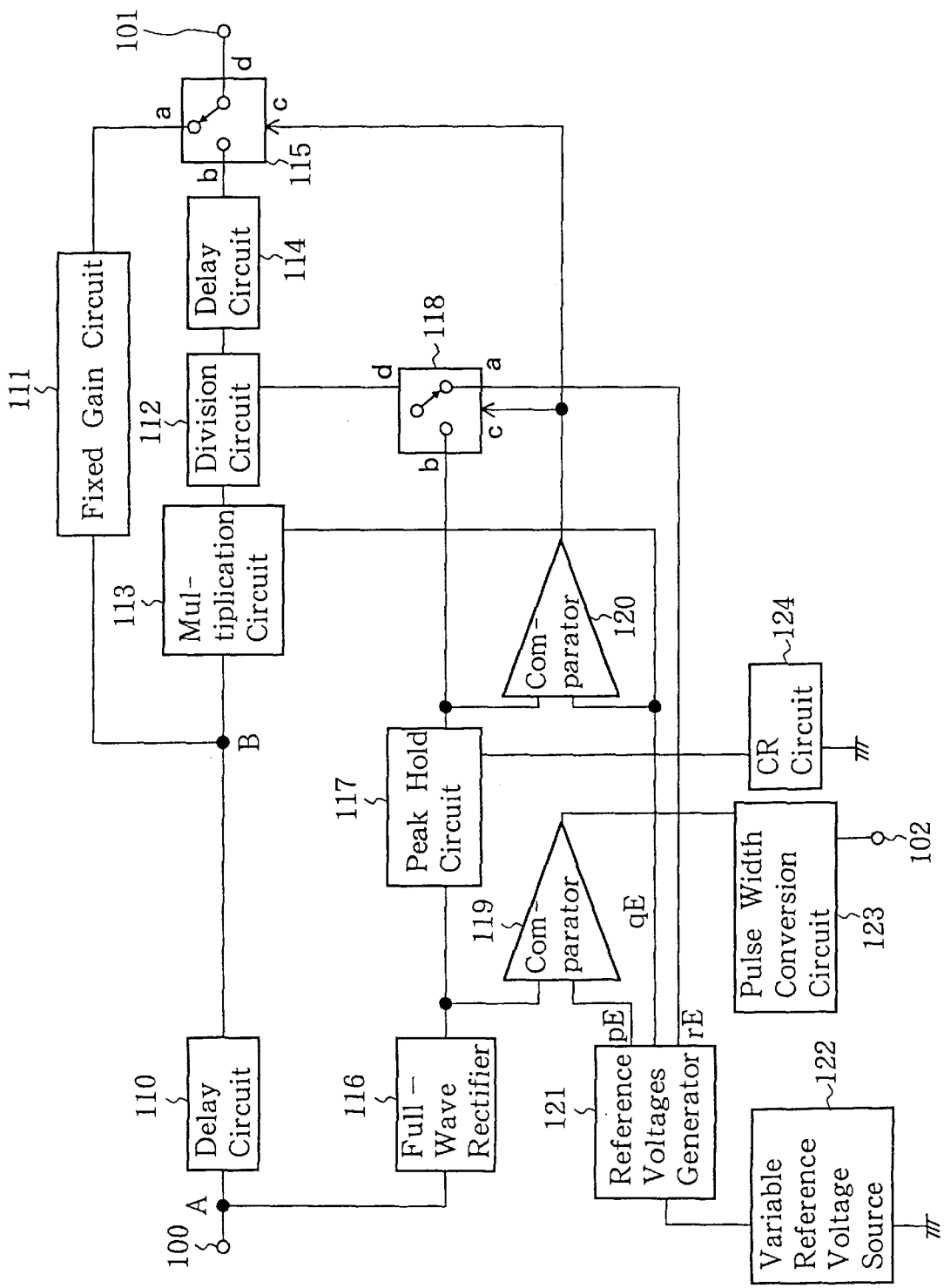
FIG. 4 is a block diagram of a modified version of the first embodiment.

FIG. 4 shows a modified version of the embodiment depicted in FIG. 1. In this modification, the order in which division circuit 112 and multiplication circuit 113 are connected has been reversed. Although the operation of this modified version is substantially the same as that of the embodiment shown in FIG. 1, the conditions expressed by Equation (4) are modified as follows:

$$K2 = K3(r/q)$$

$$v = \zeta + \eta + \xi$$

$$\gamma + \eta = \sigma + \tau \qquad (4')$$

$\gamma$, $\eta$, $\sigma$, and $\tau$ do not have to satisfy the relation expressed in Equation (4') exactly, and can also be related as follows:

$$\gamma + \eta \geq \sigma + \tau.$$

Figure 5:
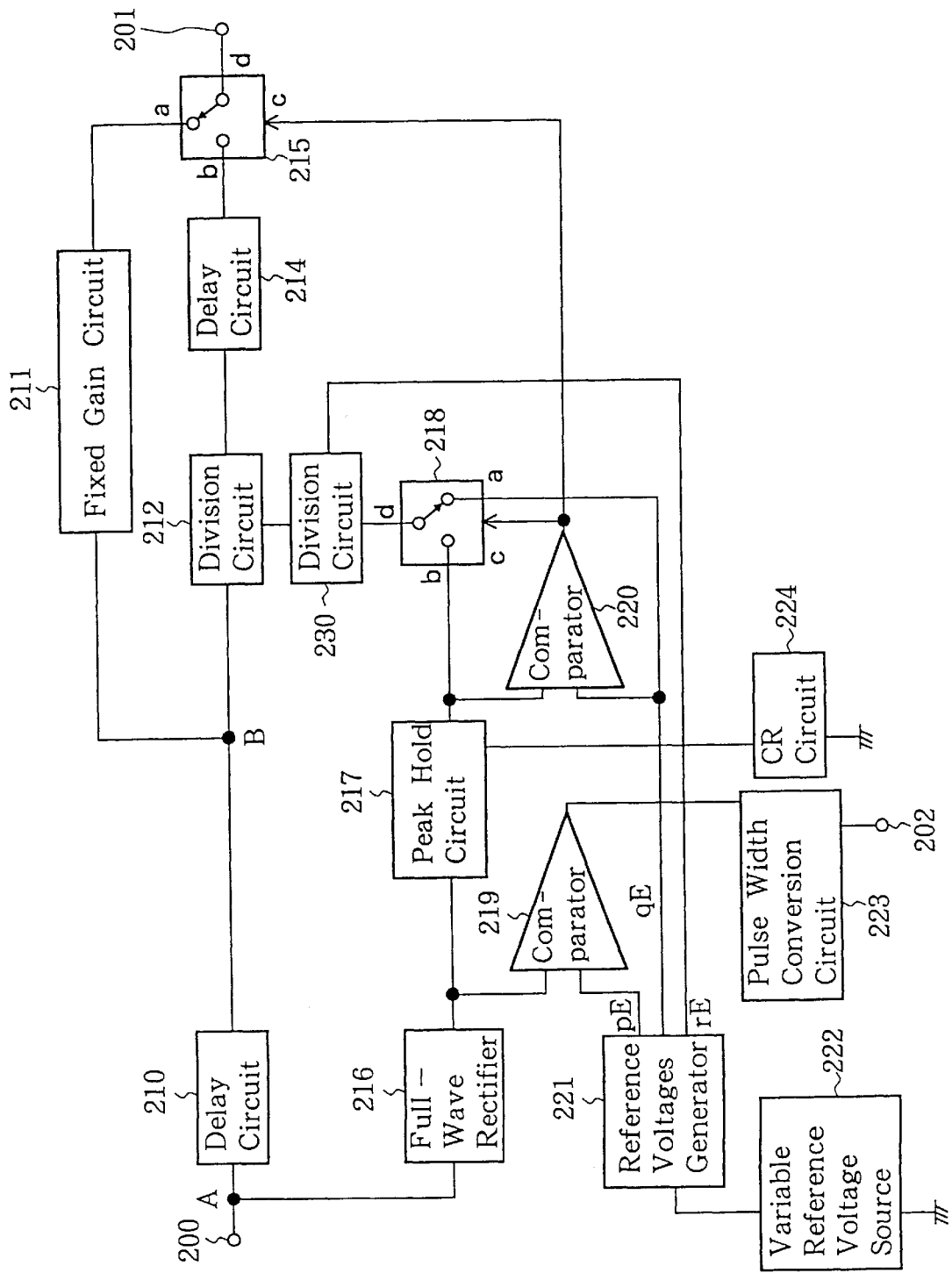
FIG. 5 is a block diagram of a second embodiment of the invention.

FIG. 5 shows a second embodiment of this invention. This embodiment comprises input terminal 200, output terminal 201, output terminal 202 for a signal causing a warning lamp to flash, delay circuits 210 and 214, fixed gain circuit 211, division circuits 212 and 230, switching circuits 215 and 218, full-wave rectifying circuit 216, peak hold circuit 217, comparators 219 and 220, reference voltages generator 221, variable reference voltage source 222, pulse width conversion circuit 223, and CR circuit 224 for controlling the decay time of peak hold circuit 217.

A description will now be given of the signal flow in this second embodiment depicted in FIG. 5, and of the functions of its various circuits.

A signal f(t) input from input terminal 200 is first of all split into two branches at point A, with one branch being delayed by delay circuit 210 having a delay of $\gamma$, giving a signal K1f(t–$\gamma$), where K1 is the amplification factor (or attenuation) of delay circuit 210. The output of delay circuit 210 is split into two branches at point B, with one branch being delayed by fixed gain circuit 211 having a delay of v, giving a signal K1K2f(t–$\gamma$–v) which is fed to input terminal a of switching circuit 215. K2 is the amplification factor (or attenuation) of fixed gain circuit 211.

The other branch of the signal which was input from input terminal 200 and branched at point A is full-wave rectified by full-wave rectifying circuit 216, giving signal Rc(t–$\sigma$), where $\sigma$ is the delay in this full-wave rectifying circuit. Peak hold circuit 217 is then used to obtain the peak value Pd(t–$\sigma$–$\tau$) of the output signal from full-wave rectifying circuit 216, where $\tau$ is the delay of the peak hold circuit. The decay time of peak hold circuit 217 is adjusted by CR circuit 224. The output signal from the peak hold circuit is fed to input terminal b of switching circuit 218.

Variable reference voltage E is generated by variable reference voltage source 222 and supplied to reference voltages generator 221, which generates voltages pE, qE and rE.

Voltage pE is supplied to comparator 219 where it is compared with the output signal Rc(t–$\sigma$) of full-wave rectifying circuit 216. Comparator 219 outputs a high level signal if the output of full-wave rectifying circuit 216 is larger than voltage pE, and a low level signal if the output is smaller. After the time width of this output signal has been converted by pulse width conversion circuit 223, the resulting signal is output, to terminal 202 as a signal for causing an alarm lamp to flash. In this embodiment, the signal for causing an alarm lamp to flash is obtained by means of separately provided comparator 219, but it is also feasible to use, for this purpose, the output (control) signal of comparator 220.

Voltage qE generated by reference voltages generator 221 is fed to input terminal a of switching circuit 218, which is set up so that terminal a to terminal d is conductive when the control signal is at a low level, and terminal b to terminal d is conductive when the control signal is at a high level. The output signal from peak hold circuit 217 is compared with voltage qE by comparator 220, which outputs a low level signal if the output of the peak hold circuit is smaller than voltage qE, and a high level signal if it is larger. The signal output from comparator 220 is supplied to control terminal c of switching circuit 218. The output of switching circuit 218 is divided in division circuit 230 by output rE of reference voltages generator 221.

The other branch of the signal branched at point B is divided in division circuit 212 by the output signal of division circuit 230, and after passing through delay circuit 214 with delay ξ and amplification factor (or attenuation) K3, is fed to input terminal b of switching circuit 215.

Switching circuit 215 is set up so that a–d is conductive when the control signal obtained from the output of comparator 220 is low, and b–d is conductive when the control signal is high. The signal, which appears at output terminal d of switching circuit 215, is fed to output terminal 201.

The operation of this second embodiment will now be described in greater detail using mathematical expressions.

Firstly, when the output (control) signal of comparator 220 is low, i.e., when $$Pd(t-\sigma-\tau)<qE$$

path a–d through switching circuit 215 is conductive, and hence given a signal f(t) input from input terminal 200 and passing through delay circuit 210 and fixed gain circuit 211, the signal obtained at output terminal 201 will be:

$$K1 \cdot K2 \cdot f(t-\gamma-\nu) \qquad (5)$$

Given the configuration of this second embodiment, when the output (control) signal of comparator 220 is low, the signal obtained as the output of division circuit 230 is:

$$qE \div rE = (q/r).$$

It follows that the output of division circuit 212 in this second embodiment is:

$$K1 \cdot f(t-\gamma-\nu) \div (q/r).$$

Accordingly, the signal which appears at terminal b of switching circuit 215 is:

$$(K1 \cdot K3 \cdot f(t-\gamma-\zeta-\xi) \div (q/r)) = K1 \cdot K3 \cdot (r/q) \cdot f(t-\gamma-\zeta-\xi) \qquad (6)$$

where ζ is the delay of division circuit 212.

Next, if the output of comparator 220 goes high, i.e., if $$Pd(t-\sigma-\tau) \geq qE$$

path b–d through switching circuit 218 becomes conductive, and hence the signal obtained at the output of division circuit 230 is:

$$Pd(t-\sigma-\tau-\zeta) \div rE$$

and therefore the signal obtained at terminal b of switching circuit 215 is:

$$K1 \cdot K3 \cdot (rE-Pd(t-\sigma-\tau-\zeta)) \cdot f(t-\gamma-\zeta-\xi) \qquad (7)$$

on the assumption that the delay of division circuit 230 is equal to the delay of division circuit 212.

In this embodiment, the state of terminal a and of terminal b immediately before switching circuit 215 switches can be described respectively by Equation (5) and Equation (6) above. It follows that the values of the two equations must be equal in order for the waveform present at output terminal 201 to be smooth and continuous immediately after the circuit has switched. Setting these conditions, we get:

$$K2=K3(r/q)$$

$$\nu=\zeta+\xi$$

$$\gamma=\sigma+\tau+\zeta \qquad (8)$$

given the assumption that the delays of switching circuits 215 and 218, and of comparators 219 and 220, are negligible in comparison with the delays of the other circuits. γ, σ, τ, and ζ do not have to satisfy the relation expressed in Equation (8) exactly, and can also be related as follows:

$$\gamma \geq \sigma+\tau+\zeta.$$

Figure 6:
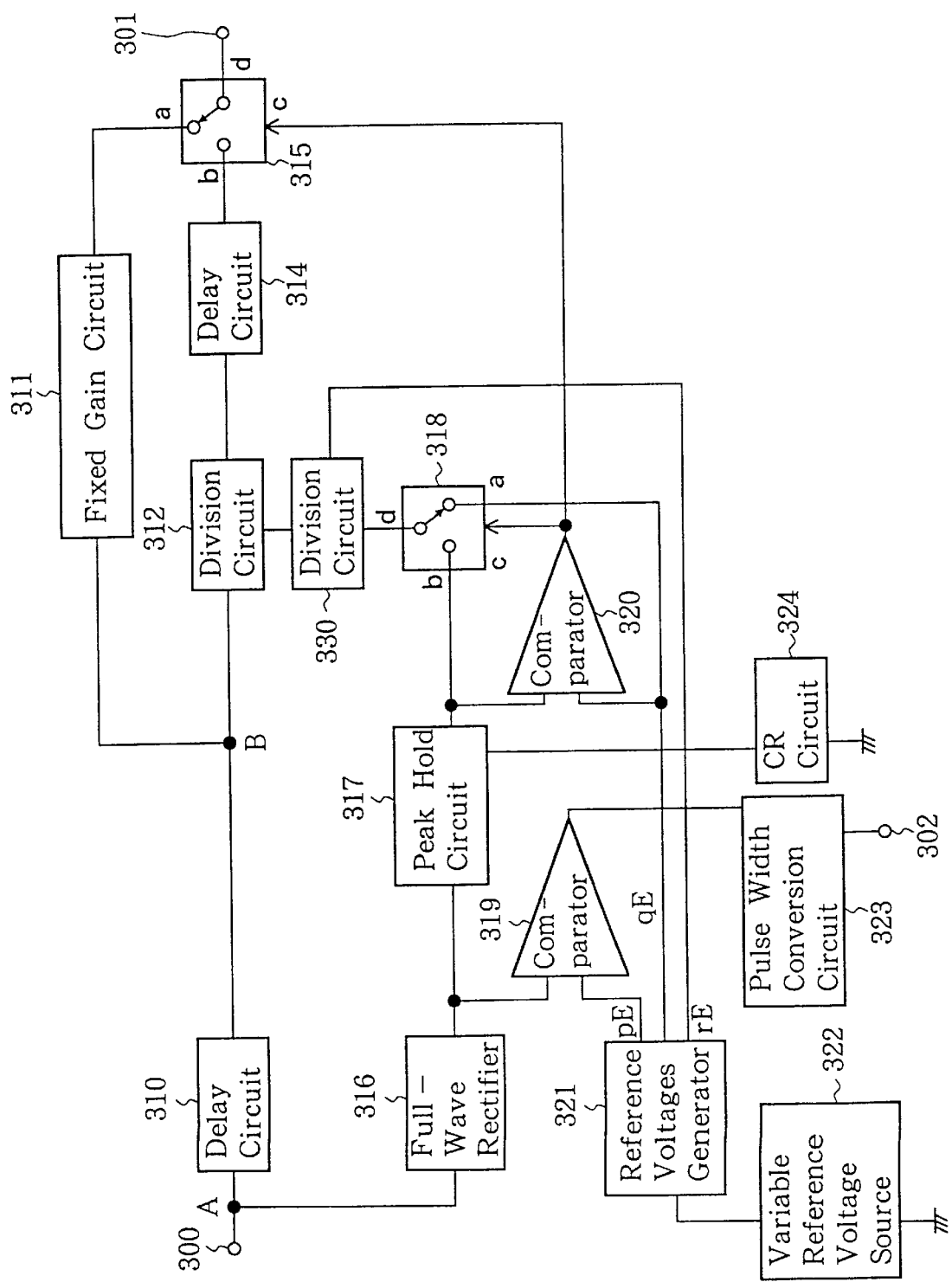
FIG. 6 is a block diagram of a third embodiment of the invention.

FIG. 6 shows a third embodiment of this invention. This embodiment comprises input terminal 300, output terminal 301, output terminal 302 for a signal for causing a warning lamp to flash, delay circuits 310 and 314, fixed gain circuit 311, multiplication circuit 313, division circuit 330, switching circuits 315 and 318, full-wave rectifying circuit 316, peak hold circuit 317, comparators 319 and 320, reference voltages generator 321, variable reference voltage source 322, pulse width conversion circuit 323, and CR circuit 324 for controlling the decay time of peak hold circuit 317.

A description will now be given of the signal flow in this third embodiment depicted in FIG. 6, and of the functions of its various circuits.

A signal f(t) input from input terminal 300 is first of all split into two branches at point A, with one branch being delayed by delay circuit 310 having a delay of γ, giving a signal K1f(t–γ), where K1 is the amplification factor (or attenuation) of delay circuit 310. The output of delay circuit 310 is split into two branches at point B, with one branch being delayed by fixed gain circuit 311 having a delay of ν, giving a signal K1K2f(t–γ–ν), which is fed to input terminal a of switching circuit 315. K2 is the amplification factor (or attenuation) of fixed gain circuit 311.

The other branch of the signal which was input from input terminal 300 and branched at point A is full-wave rectified by full-wave rectifying circuit 316, giving signal Rc(t–σ), where σ is the delay in full-wave rectifying circuit 316. Peak hold circuit 317 is then used to obtain the peak value Pd(t–σ–τ) of the output signal from full-wave rectifying circuit 316, where τ is the delay of the peak hold circuit. The decay time of peak hold circuit 317 is adjusted by CR circuit 324. The output signal from the peak hold circuit is fed to input terminal b of switching circuit 318.

Variable reference voltage E is generated by variable reference voltage source 322 and supplied to reference voltages generator 321, which generates voltages pE, qE and rE.

Voltage pE is supplied to comparator 319 where it is compared with the output signal Rc(t–σ) of full-wave rectifying circuit 316. Comparator 319 outputs a high level signal if the output of the full-wave rectifying circuit is larger than voltage pE, and a low level signal if the output is smaller. After the time width of this output signal has been converted by pulse width conversion circuit 323, the resulting signal is output to terminal 302 as a signal for causing an alarm lamp to flash. In this embodiment, the signal for causing an alarm lamp to flash is obtained by means of separately provided comparator 319, but it is also feasible to use, for this purpose, the output (control) signal of comparator 320.

Voltage qE generated by reference voltages generator 321 is fed to input terminal a of switching circuit 318, which is set up so that terminal a to terminal d is conductive when the control signal is at a low level, and terminal b to terminal d is conductive when the control signal is at a high level. The output signal from peak hold circuit 317 is compared with voltage qE by comparator 320, which outputs a low level signal if the output of the peak hold circuit is smaller than voltage qE, and a high level signal if it is larger. The signal output from comparator 320 is supplied to control terminal c of switching circuit 318. The output rE of reference voltages generator 321 is divided in division circuit 330 by the output of switching circuit 318.

The other branch of the signal branched at point B is multiplied in multiplication circuit 313 by the output signal of division circuit 330, and after passing through delay circuit 314 with delay $\xi$ and amplification factor (or attenuation) K3, is fed to input terminal b of switching circuit 315.

Switching circuit 315 is set up so that a–d is conductive when the control signal obtained from the output of comparator 320 is low, and b–d is conductive when the control signal is high. The signal, which appears at output terminal d of switching circuit 315, is fed to output terminal 301.

The operation of this third embodiment will now be described in greater detail using mathematical expressions.

Firstly, when the output (control) signal of comparator 320 is low, i.e., when $$Pd(t-\sigma-\tau) < qE$$

path a–d through switching circuit 315 is conductive, and hence the signal obtained at output terminal 301 is:

$$K1 \cdot K2 \cdot f(t-\gamma-\nu) \quad (9)$$

This third embodiment is configured so that when the output (control) signal of comparator 320 is low, the signal obtained as the output of division circuit 330 is:

$$rE \div qE = (r/q).$$

It follows that the output of multiplication circuit 313 is:

$$K1 \cdot f(t-\gamma-\zeta) \cdot (r/q)$$

and that the signal formed at terminal b of switching circuit 315 is:

$$(K1 \cdot K3 \cdot f(t-\gamma-\zeta-\xi) \cdot (r/q)) = K1 \cdot K3 \cdot (r/q) \cdot f(t-\gamma-\zeta-\xi) \quad (10)$$

where $\zeta$ is the delay of multiplication circuit 313.

Next, if the output of comparator 320 is high, i.e., if $$Pd(t-\sigma-\tau) \geq qE$$

the output of division circuit 330 will be:

$$rE \div Pd(t-\sigma-\tau-\zeta)$$

where $\zeta$ is the delay of division circuit 330. The signal obtained at terminal b of switching circuit 315 is therefore:

$$K1 \cdot K3 \cdot (rE \div Pd(t-\sigma-\tau-\zeta)) \cdot f(t-\gamma-\zeta-\xi) \quad (11)$$

In this embodiment, the state of terminal a and of terminal b immediately before switching circuit 315 switches can be described respectively by Equation (9) and Equation (10) above. It follows that the values of the two equations must be equal in order for the waveform present at output terminal 301 to be smooth and continuous immediately after the circuit has switched. Setting these conditions, we get:

$$K2 = K3(r/q)$$

$$\nu = \zeta + \xi$$

$$\gamma = \sigma + \tau + \zeta \quad (12)$$

It may be noted that this consideration of the operation of the third embodiment has assumed that the delays of switching circuits 315 and 318, and of comparators 319 and 320, are negligible in comparison with the delays of the other circuits. In this embodiment as well, the relation among $\gamma$, $\sigma$, $\tau$, and $\zeta$ can also be:

$$\gamma \geq \sigma + \tau + \zeta.$$

The embodiments described above are ones in which analogue signals are processed, but it is also feasible to implement this invention using digital circuits. Namely, the various circuit blocks depicted in FIG. 1, FIG. 4, FIG. 5 and FIG. 6 can each be implemented using logic circuits, an analogue-to-digital converter can be provided on the input side to convert input signals to digital signals, and a digital-to-analogue converter can be provided on the output side to convert the processing results to, and output them as, analogue signals.

Instead of implementing the various blocks as logic circuits, data processing can also be performed by storing a processing program in a memory (ROM or RAM) in advance and running this program in a processor. In this case, the various circuit blocks shown in FIG. 1, FIG. 4, FIG. 5 and FIG. 6 are each implemented as a functional block of software (a program).

Figure 7:
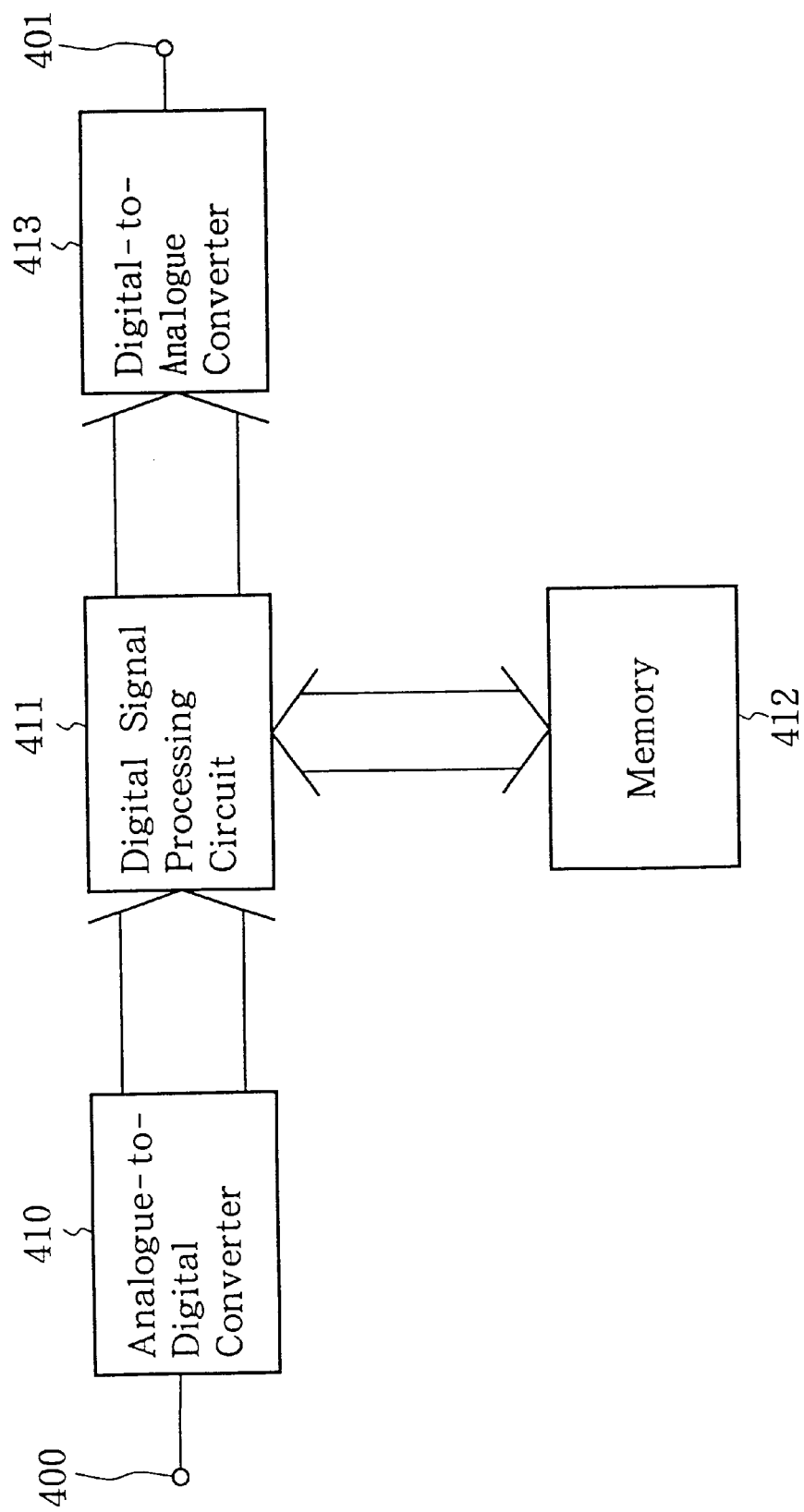
FIG. 7 is a block diagram of a fourth embodiment of the invention, showing the configuration when a digital signal processing circuit is used.
Figure 8:
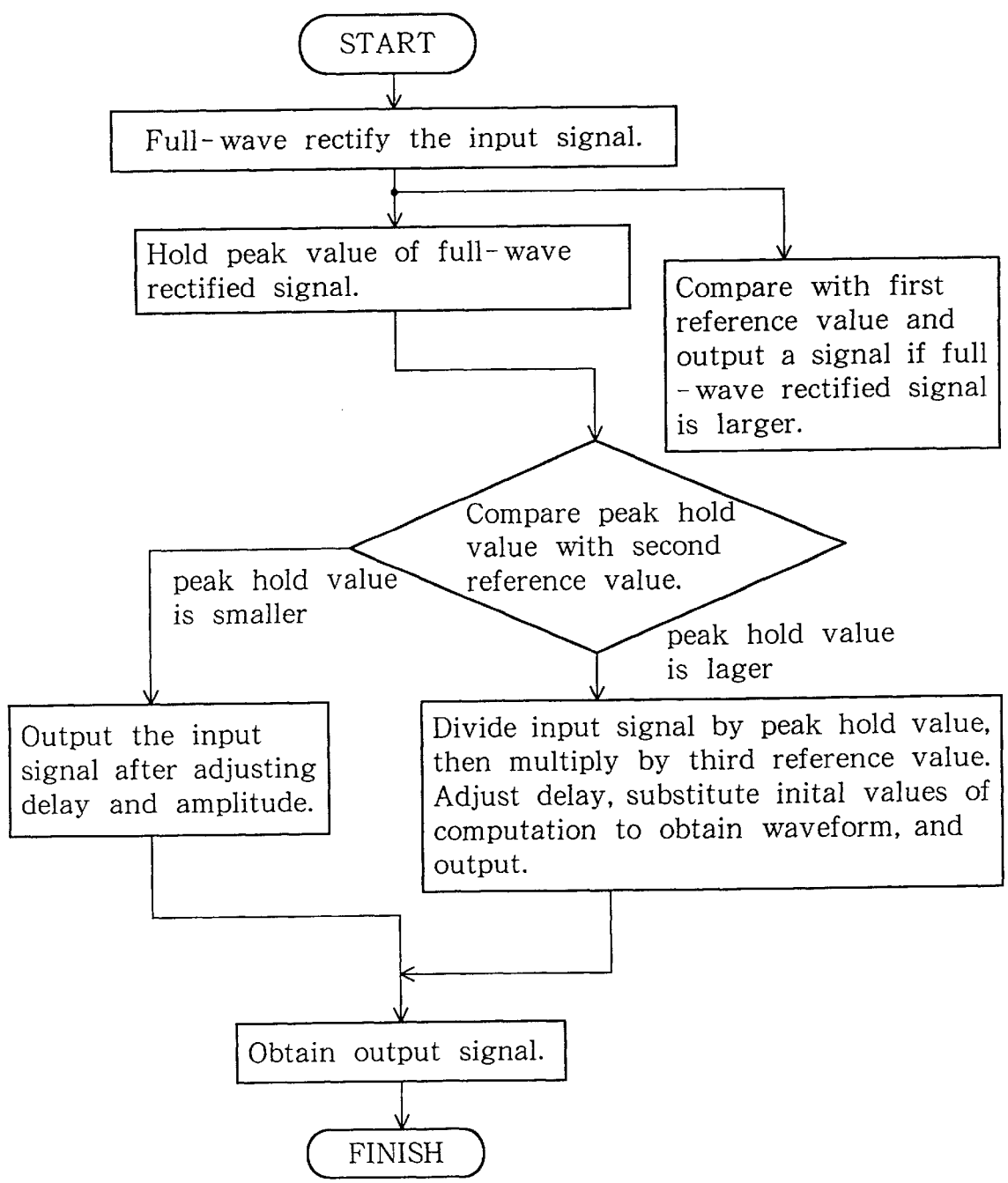
FIG. 8 is a flowchart of the signal processing performed by the digital signal processing circuit.

FIG. 7 and FIG. 8 show a fourth embodiment of the present invention, wherein the same operation as that of the FIG. 1 embodiment is implemented using a digital signal processing circuit. FIG. 7 shows the overall circuit configuration, and FIG. 8 is a flowchart of its signal processing. The circuit illustrated in FIG. 7 comprises input terminal 400, analogue-to-digital converter 410, digital signal processing circuit 411, memory 412, digital-to-analogue converter 413, and output terminal 401.

In this embodiment, an input signal is converted to a digital signal by analogue-to-digital converter 410 with 16-bit precision and a sampling frequency of 10 kHz, and the resulting digital signal is input to digital signal processing circuit 411. By using a 16-bit digital signal, a dynamic range of $$20 \log 2^{16} = 96 \text{ dB}$$

can be secured for the signal.

The use of a 16-bit digital signal also guarantees sufficient precision in the multiplication and division. An automatic dynamic range control circuit implemented using the individual circuits of the first embodiment shown in FIG. 1 is implemented in this fourth embodiment by means of digital operations of digital signal processing circuit 411 in accordance with a sequence of programs written in memory 412. The result of these digital operations is converted to an analogue signal by digital-to-analogue converter 413.

By changing the sequence of programs written in memory 412, the second and third embodiments shown in FIG. 5 and FIG. 6 can also and in similar manner be implemented using digital signal processing techniques.

As has been explained above, an automatic dynamic range control circuit according to the present invention switches the processing path in accordance with the input signal level, and therefore regardless of the level of the input signal level, the circuit is not susceptible to noise and does not produce unnatural-sounding output when a human voice signal is input. It can maintain a good signal-to-noise ratio and can control the dynamic range of an input signal.

Quality degradation arising from waveform discontinuity does not occur when an automatic dynamic range control circuit according to the present invention switches between operating paths. Moreover, no distortion occurs in the output signal when, in response to an excessively high level input signal, the automatic dynamic range control circuit has switched to its dynamic range control circuit.

We claim:

1. An automatic dynamic range control circuit comprising:

fixed-gain first circuit means (111 or 211 or 311);

variable-gain second circuit means (112–114 or 212–214 or 312–314) with propagation delay substantially equal to that of the first circuit means;

peak value hold means (116, 117 or 216, 217 or 316, 317) for holding the peak value of the input signal;

comparison means (120 or 220 or 320) for comparing the value held by the peak value hold means with a preset reference signal level; and first selection means (115 or 215 or 315) which on the basis of the result of the comparison by the comparison means, selects the first circuit means when the value held by the peak value hold means is smaller than the reference signal level, and selects the second circuit means when the value held by the peak value hold means exceeds the reference signal level;

said automatic dynamic range control circuit being characterized in that:

it comprises second selection means (118 or 218 or 318) which on the basis of the result of the comparison by the comparison means, selects the reference signal when the value held by the peak value hold means is smaller than the reference signal level, and selects the value held by the peak value hold means when this value exceeds the reference signal level, and outputs the selected value as a control signal for setting the gain of the second circuit means; and the maximum output level of the second circuit means is limited by the aforesaid control signal, its output level being kept substantially fixed when the value held by the peak value hold means is input as the control signal, and the second circuit means operating with a fixed gain substantially equal to that of the first circuit means when the reference signal is input as the control signal.

2. An automatic dynamic range control circuit according to claim 1, wherein delay means (110 or 210 or 310) is provided at the input of the first and second circuit means, these delay means delaying the input signals of these first and second circuit means until the gain of the second circuit means has been set relative to the input signal.

3. An automatic dynamic range control circuit according to claim 1, wherein means (119, 123 or 219, 223 or 319, 323) which outputs an alarm signal when the peak value of the input signal exceeds a predetermined level is provided.

4. An automatic dynamic range control circuit according to claim 1, wherein the reference signal level and the corresponding maximum output level of the second circuit means are variable.

5. An automatic dynamic range control circuit according to claim 4, wherein there is provided a reference voltages generating means (121) for generating a plurality of reference voltages (qE and rE) which have a fixed mutual ratio;

one of these plurality of reference voltages (qE) is used as a reference signal; and the aforesaid second circuit means comprises a division circuit (112) which divides the input signal by the output of the second selection means (118), and a multiplication circuit (113) which multiplies the output of this division circuit by one of the plurality of reference voltages.

6. An automatic dynamic range control circuit according to claim 4, wherein there is provided a reference voltages generating means (121) for generating a plurality of reference voltages (qE and rE) which have a fixed mutual ratio;

one of these plurality of reference voltages (qE) is used as a reference signal; and the aforesaid second circuit means comprises multiplication means (113) which multiplies the input signal by one of the plurality of reference voltages, and division means (112) which divides the output of this multiplication means by the output of the second selection means (118).

7. An automatic dynamic range control circuit according to claim 4, wherein there is provided a reference voltages generating means (221) for generating a plurality of reference voltages (qE and rE) which have a fixed mutual ratio;

one of these plurality of reference voltages (qE) is used as a reference signal; and the aforesaid second circuit means comprises a first division means (230) which divides the output of the second selection means (218) by one of the plurality of reference voltages, and a second division means (212) which divides the input signal by the output of this first division means.

8. An automatic dynamic range control circuit according to claim 4, wherein there is provided a reference voltages generating means (321) for generating a plurality of reference voltages (qE and rE) which have a fixed mutual ratio;

one of these plurality of reference voltages (qE) is used as a reference signal; and the aforesaid second circuit means comprises a division means (330) which divides one of the plurality of reference voltages by the output of the second selection means (318), and multiplication means (313) which multiplies the input signal by the output of this division means.

\* \* \* \* \*